(12) United States Patent
Guo (10) Patent No.: US 7,468,874 B1
(45) Date of Patent: Dec. 23, 2008

(54) PROTECTION CIRCUIT FOR DIGITAL POWER MODULE

(75) Inventor: Sam Yonghon Guo, Canton, MI (US)

(73) Assignee: Yazaki North America, Inc., Canton, MI (US)

( * ) Notice: Subject to any disclaimer, the term of this patent is extended or adjusted under 35 U.S.C. 154(b) by 2 days.

(21) Appl. No.: 11/269,192

(22) Filed: Nov. 8, 2005

(51) Int. Cl.
*H02H 3/00* (2006.01)
*H02H 3/08* (2006.01)
*H02H 5/04* (2006.01)
*H02H 9/08* (2006.01)

(52) U.S. Cl. .................. 361/88; 361/93.1; 361/93.8; 361/93.9

(58) Field of Classification Search ............. 361/93.9, 361/93.8, 88, 93.1
See application file for complete search history.

(56) References Cited

U.S. PATENT DOCUMENTS

| | | | |
|---|---|---|---|
| 5,497,285 A | 3/1996 | Nadd | |
| 5,502,610 A * | 3/1996 | Chaney | 361/18 |
| 5,550,701 A | 8/1996 | Nadd et al. | |
| 5,737,169 A * | 4/1998 | Sellers | 361/98 |
| 5,747,975 A | 5/1998 | Colandrea et al. | |
| 5,841,649 A | 11/1998 | Willett et al. | |
| 6,043,701 A | 3/2000 | Schrittesser | |
| 6,137,165 A | 10/2000 | Thierry | |
| 6,300,146 B1 | 10/2001 | Thierry | |
| 6,320,275 B1 * | 11/2001 | Okamoto et al. | 307/10.1 |
| 6,459,167 B1 * | 10/2002 | Yamanashi | 307/9.1 |
| 6,717,787 B2 | 4/2004 | Barker | |
| 6,914,416 B2 * | 7/2005 | Thomas et al. | 320/136 |
| 7,116,110 B1 * | 10/2006 | Li | 324/522 |
| 2001/0009494 A1 | 7/2001 | Umekawa | |
| 2006/0077606 A1 * | 4/2006 | Nakamura | 361/93.1 |

OTHER PUBLICATIONS

BUK3F00-50WEHL TrenchPLUS controller 1C (Rev. 01—Nov. 1, 2004).

\* cited by examiner

*Primary Examiner*—Stephen W Jackson
*Assistant Examiner*—Lucy Thomas
(74) *Attorney, Agent, or Firm*—Harness, Dickey & Pierce, P.L.C.

(57) ABSTRACT

A sensorless protection circuit comprises a detection module. The detection module receives a reference voltage signal and receives a load voltage signal from a MOSFET. The detection module generates a detection signal having a first state and a second state according to the reference voltage signal and the load voltage signal. A protection module receives the detection signal and maintains the MOSFET in an ON state when the detection signal is in the first state and transitions the MOSFET from the ON state to an OFF state when the detection signal is in the second state. The detection signal is in the second state when the MOSFET is in at least one of a current overload condition, an over temperature condition, a startup inrush current condition, and a short circuit condition.

14 Claims, 7 Drawing Sheets

FIG. 3A

Diagnosis Table

| In | Status 1 | Status 2 | Results |
|---|---|---|---|
| High | Low | X | Normal |
| High | High | X | Open FET |
| Low | Low | X | Open Load |
| Low | High | X | Normal |
| High | X | Low | Over Current, Over Temp or Load Short |

X = Don't Care

PROTECTION CIRCUIT FOR DIGITAL POWER MODULE

FIELD OF THE INVENTION

The present invention relates to power MOSFETS, and more particularly to a protection circuit for a power MOSFET.

BACKGROUND OF THE INVENTION

Metal-oxide semiconductor field effect transistors (MOSFETs) are voltage-controlled power devices that are capable of handling large current flow. Typically, MOSFETS are used in high-speed switching applications and integrated circuits (ICs). For example, a digital power module (DPM) for an automotive vehicle may include one or more power MOSFETs for solid-state power switching. Vehicle body control functions and power distribution functions may be integrated on a vehicle DPM. These functions include, but are not limited to, interior and exterior lighting, windshield wipers, horn, air conditioning, clutch, fuel pump, starter relay, blower, system diagnostics, and/or smart fusing. MOSFETS may provide the smart fusing and/or other functions in the DPM.

A circuit or device that includes a MOSFET may include current overload, short circuit, and/or over temperature protection elements. For example, a circuit may include a current sensor and/or a temperature sensor to detect when a MOSFET is exposed to one or more of the above conditions.

Figure 1:
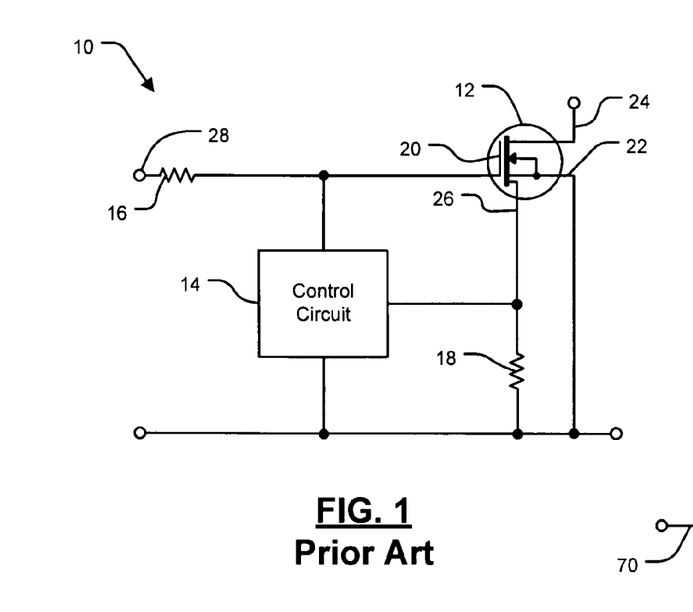
FIG. 1 is a circuit schematic of a MOSFET protection circuit that according to the prior art.

Referring now to FIG. 1, an exemplary MOSFET circuit 10 includes a smart or sense MOSFET 12, a control circuit 14, a gate resistor 16, and a current detection resistor 18. The MOSFET 12 includes at least a gate terminal 20, a source terminal 22, a drain terminal 24, and a current detection terminal 26. The gate terminal 20 is connected to an input voltage 28 through the gate resistor 16. The control circuit 14 senses a current through the current detection resistor 18. The current through the current detection resistor 18 is indicative of a current through the MOSFET 12. Therefore, the control circuit 14 determines the current through the MOSFET 12. For example, the control circuit 14 may determine when the current through the MOSFET 12 exceeds a particular threshold.

In certain implementations, the MOSFET 12 may include TEM (temperature) MOSFET functions. A TEM MOSFET includes one or more temperature detection terminals (not shown). The temperature detection terminals output a signal that is indicative of a temperature of the MOSFET 12. In this manner, the control circuit 14 may determine when the temperature of the MOSFET 12 exceeds a particular threshold.

Therefore, a MOSFET circuit according to the above embodiments relies on smart, sense, and/or TEM MOSFETs for current overload and/or over temperature protection. Smart, sense, and TEM MOSFETs require additional terminals to provide the current/temperature sensing functions, thereby increasing package size and cost. Further, the additional terminals reduce space available for bonding wires. Alternatively, a MOSFET circuit may include a power shunt resistor to sense a load current. However, in large current applications, the shunt resistor may generate significant heat, which is undesirable.

SUMMARY OF THE INVENTION

A sensorless protection circuit comprises a detection module. The detection module receives a reference voltage signal and receives a load voltage signal from a MOSFET. The detection module generates a detection signal having a first state and a second state according to the reference voltage signal and the load voltage signal. A protection module receives the detection signal and maintains the MOSFET in an ON state when the detection signal is in the first state and transitions the MOSFET from the ON state to an OFF state when the detection signal is in the second state. The detection signal is in the second state when the MOSFET is in at least one of a current overload condition, an over temperature condition, and a short circuit condition.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiments is merely exemplary in nature and is in no way intended to limit the invention, its application, or uses. For purposes of clarity, the same reference numbers will be used in the drawings to identify similar elements. As used herein, the term module and/or device refers to an application specific integrated circuit (ASIC), an electronic circuit, a processor (shared, dedicated, or group) and memory that execute one or more software or firmware programs, a combinational logic circuit, and/or other suitable components that provide the described functionality.

Figure 2:
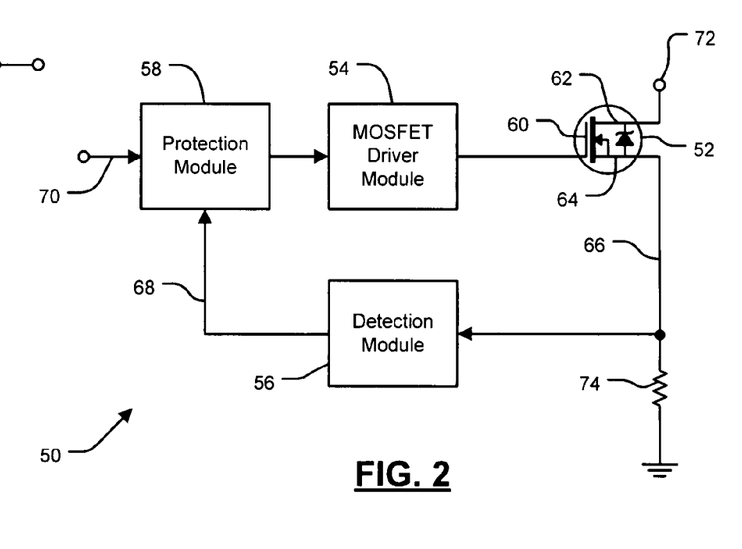
FIG. 2 is a functional block diagram of a sensorless MOSFET protection circuit according to the present invention.

Referring now to FIG. 2, a sensorless MOSFET protection circuit 50 is shown. The protection circuit 50 includes a MOSFET 52, a MOSFET driver module 54, a detection module 56, and a protection module 58. The MOSFET 52 includes a gate terminal 60, a drain terminal 62, and a source terminal 64. Typically, certain characteristics of a MOSFET are temperature sensitive. For example, a voltage drop across the drain terminal 62 and the source terminal 64 is indicative of a load current at a particular temperature of the MOSFET 52. Similarly, a voltage drop across the drain terminal 62 and the source terminal 64 is indicative of a temperature of the MOSFET 52 at a particular load current. In other words, when certain characteristics of the MOSFET 52 are known, other characteristics, such as current and temperature, may be determined.

The source terminal 64 outputs a detection signal 66. The detection signal 66 is indicative of a temperature and/or a load current of the MOSFET 52. The detection module 56 receives the detection signal 66 and generates a detection output signal 68. For example, the detection output signal 68 is indicative of whether the detection signal 66 is above or below a threshold. When the detection signal 66 is above or below the threshold, the detection output signal 68 is indicative of a short circuit, current overload, and/or an over temperature condition. Additionally, the detection output signal 68 may be indicative of a startup inrush current condition. Similarly, the detection output signal 68 may be indicative of whether the detection signal 66 is within a range of values. When the detection signal 66 is within or outside the range of values, the detection output signal 68 is indicative of the short circuit, current overload, and/or over temperature condition.

The protection module 58 receives the detection output signal 68 and an input control signal 70. When the detection output signal 68 indicates a short circuit, current overload, and/or over temperature condition, the protection module 58 turns OFF the MOSFET 52. When the MOSFET 52 is ON, current flows from an power supply voltage (such as a battery voltage source) 72, through the MOSFET 52, to a load 74. As such, the detection signal 66 is indicative of a voltage of the load 74. When the MOSFET 52 is OFF, the MOSFET 52 prevents current flow to the load 74. When the protection module 58 turns OFF the MOSFET 52, the input control signal 70 is used to reset the protection module 58 and return the MOSFET 52 to an ON state.

Figure 3A:
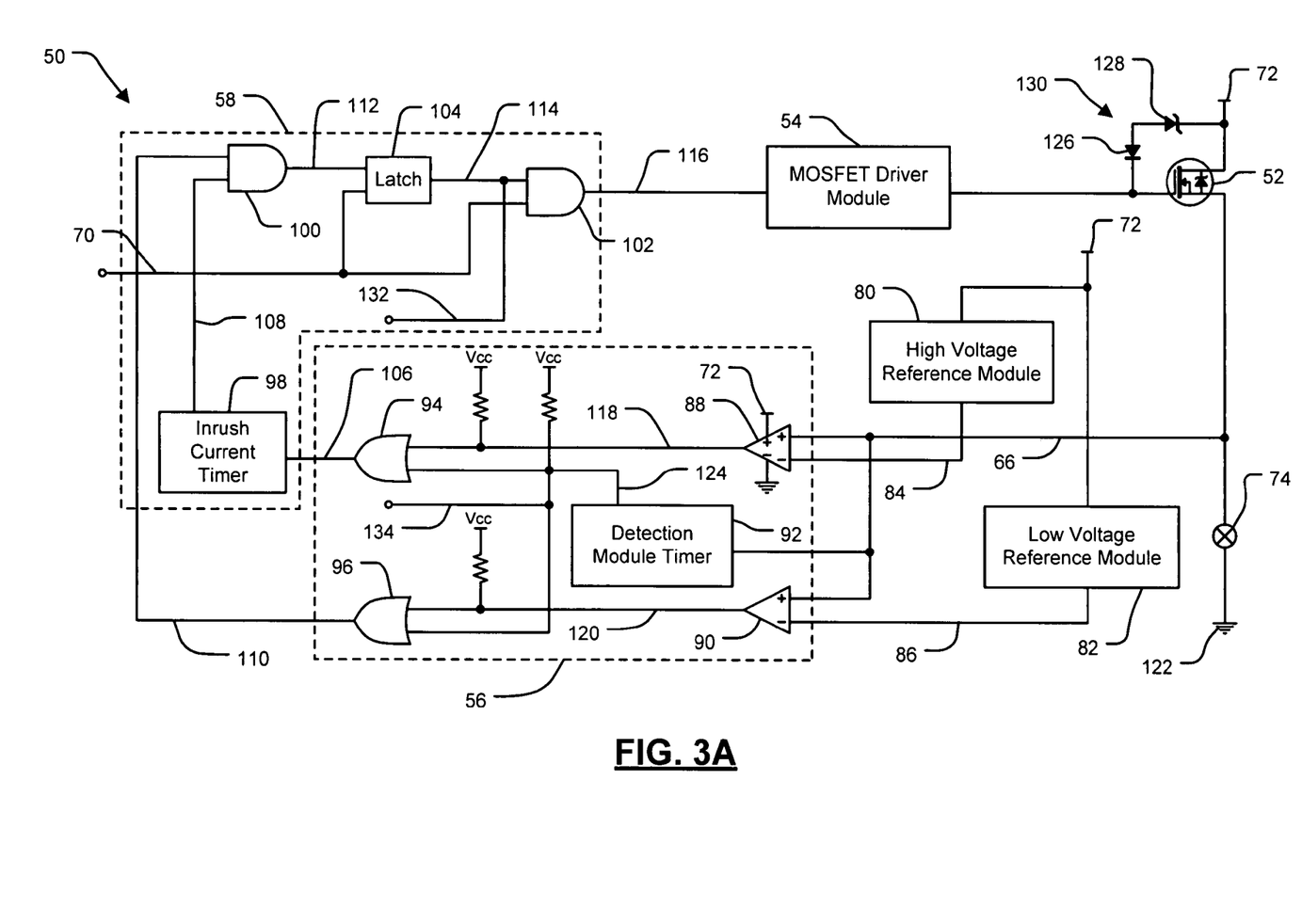
FIG. 3A is a functional block diagram of a sensorless MOSFET protection circuit according to the present invention.

Referring now to FIG. 3A, a first implementation of the sensorless MOSFET protection circuit 50 is shown in more detail. In addition to the elements described in FIG. 2, the protection circuit 50 may include a high voltage reference module 80 and a low voltage reference module 82. The high voltage reference module 80 and the low voltage reference module 82 receive the power supply voltage 72 and generate a high voltage reference signal 84 and a low voltage reference signal 86, respectively. In other words, the high voltage reference module 80 and the low voltage reference module 82 generate voltage reference signals that are referenced to the power supply voltage 72. For example, the high voltage reference signal 84 may be a difference between the power supply voltage 72 and 0.1 volts. Similarly, the low voltage reference signal 86 may be a difference between the power supply voltage 72 and 0.5 volts.

The detection module 56 includes a first comparator 88, a second comparator 90, and a detection module timer 92. The first comparator 88 receives the detection signal 66, the high voltage reference signal 84, and the power supply voltage 72. Similarly, the second comparator 90 receives the detection signal 66 and the low voltage reference signal 86. The detection module 56 further includes logic OR gates 94 and 96.

The protection module 58 includes an inrush current timer 98, logic AND gates 100 and 102, and a latch 104. The inrush current timer 98 receives a first detection module output signal 106 from the detection module 56 and generates an inrush current timer signal 108. The logic gate 100 receives the inrush current timer signal 108 and a second detection module output signal 110. The latch 104 receives a latch control signal 112 from the logic gate 100 and the input control signal 70. The logic gate 102 receives a latch output signal 114 from the latch 104 and the input control signal 70. The logic gate 102 outputs a MOSFET control signal 116.

Typically, a first comparator output signal 118 is HIGH. The first comparator output signal 118 is HIGH when the detection signal 66 is greater than the high voltage reference signal 84. When the detection signal 66 is less than the high voltage reference signal 84, the first comparator output signal 118 is LOW. Similarly, a second comparator output signal 120 is typically HIGH. The second comparator output signal 120 is HIGH when the detection signal 66 is greater than the low voltage reference signal 86. When the detection signal 66 is less than the low voltage reference signal 86, the second comparator output signal 120 is LOW.

In the present implementation, the detection signal 66 is greater than the high voltage reference signal 84 under normal operating conditions of the MOSFET 52 (i.e. when there is no short circuit, current overload, over temperature, and/or startup inrush current condition). The first comparator output signal 118 is HIGH. Likewise, the second comparator output signal 120 is HIGH.

When there MOSFET 52 is in a current overload, over temperature, and/or startup inrush current condition, the detection signal 66 is greater than the low voltage reference signal 86 but less than the high voltage reference signal 84. The first comparator output signal 118 is LOW and the second comparator output signal 120 is HIGH.

When the MOSFET 52 is in a short circuit condition, the detection signal 66 is less than the low voltage reference signal 86. The first comparator output signal 118 is LOW and the second comparator output signal 120 is LOW.

The MOSFET 52 is ON when the MOSFET control signal 116 is HIGH. Therefore, generally, the MOSFET 52 is ON when the first comparator output signal 118, the second comparator output signal 120, and the input control signal 70 are HIGH. As can be understood by the above description, the MOSFET 52 is ON when the detection signal 66 is greater than the high voltage reference signal 84, and is otherwise OFF.

The inrush current timer 98 maintains the MOSFET 52 in an ON state during startup inrush current conditions. In other words, the inrush current timer 98 prevents the protection module 58 from turning OFF the MOSFET 52 until after a startup inrush current time. During normal operating conditions (i.e. when the detection signal 66 is greater than the high voltage reference signal 84), the inrush current timer signal 108 is HIGH. When the first comparator output signal 118 transitions from HIGH to LOW, the first detection module output signal 106 transitions from HIGH to LOW and the inrush current timer 98 begins to count for a predetermined time. For example, the inrush current timer 98 may count to 0.5 seconds, 1.0 seconds, or other predetermined times. When the inrush current timer 98 reaches the predetermined time, the inrush current timer signal 108 transitions from HIGH to LOW. In this manner, the inrush current timer 98 turns OFF the MOSFET 52 when a current overload or over temperature condition occurs without triggering due to a temporary startup inrush current condition.

When at least one of the inrush current timer signal 108 and/or the second detection module output signal 110 is LOW, the latch control signal 112 transitions from HIGH to LOW, latching the latch output signal 114 in a LOW (i.e. OFF) state. In other words, the MOSFET 52 is turned OFF. In the present implementation, the input control signal 70 is toggled from HIGH to LOW and from LOW to HIGH to return the MOSFET 52 to an ON state.

Before the MOSFET 52 is initially turned ON, the detection signal 66 is at a ground potential 122 and the first and second comparator output signals 118 and 120 are LOW. The detection module 92 receives the detection signal 66 and outputs a detection module timer signal 124. When the load 74 is OFF (i.e. when the MOSFET 52 is OFF), the detection module timer signal 124 is HIGH. The logic OR gates 94 and 96 receive the detection module timer signal 124. Therefore, the HIGH state of the detection module timer signal 124 overcomes the initial LOW states of the first and second comparator output signals 118 and 120 and the MOSFET 52 can be turned ON. When the load 74 is turned ON, the detection module timer signal 124 transitions from HIGH to LOW, and the detection module 56 and protection module 58 can function to provide protection of the MOSFET 52 as described above. In other words, the protection functions are available when the load 74 is turned ON and are not available when the load 74 is turned OFF.

The protection circuit 50 may include a diode 126 and a zener diode 128. The diode 126 and the zener diode 128 form an active clamp circuit 130 for the MOSFET 52. The active clamp circuit 130 absorbs magnetic kickback during turn off periods for inductive loads.

Figure 3B:
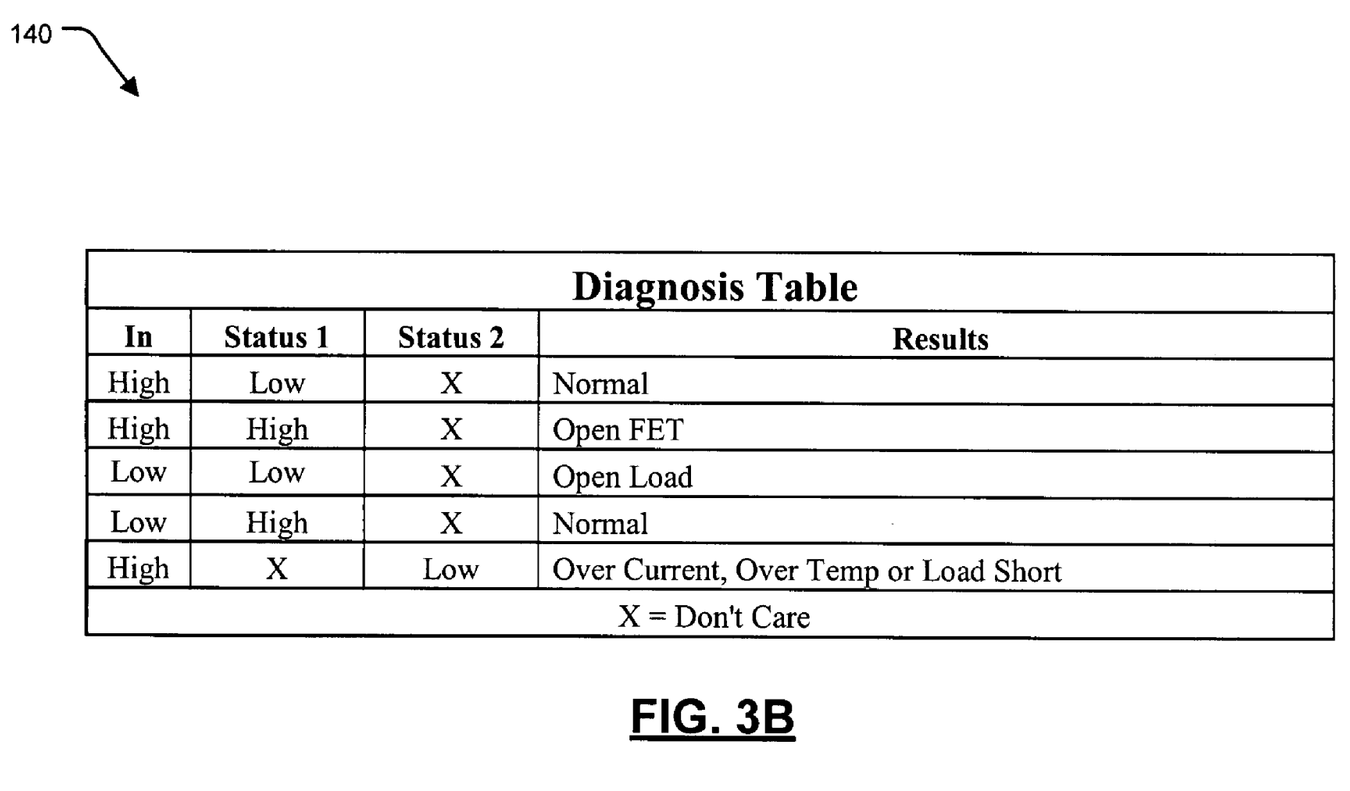
FIG. 3B is a table that illustrates status indications of the MOSFET protection circuit according to the present invention.

Referring now to FIGS. 3A and 3B, statuses of the load 74 and the MOSFET 52 can be determined according to status signals 132 and 134 and/or the input control signal 70. When the MOSFET 52 is ON, the status signal 132 is HIGH. Conversely, the status signal 132 is LOW when the MOSFET 52 is OFF. When the load 74 is ON, the status signal 134 is LOW. Conversely, the status signal 134 is HIGH when the load 74 is OFF. Referring now to FIG. 3B, a table 140 illustrates diagnosis conditions of the protection circuit 50 according to the status signals 132 and 134 and/or the input control signal 70.

Figure 4:
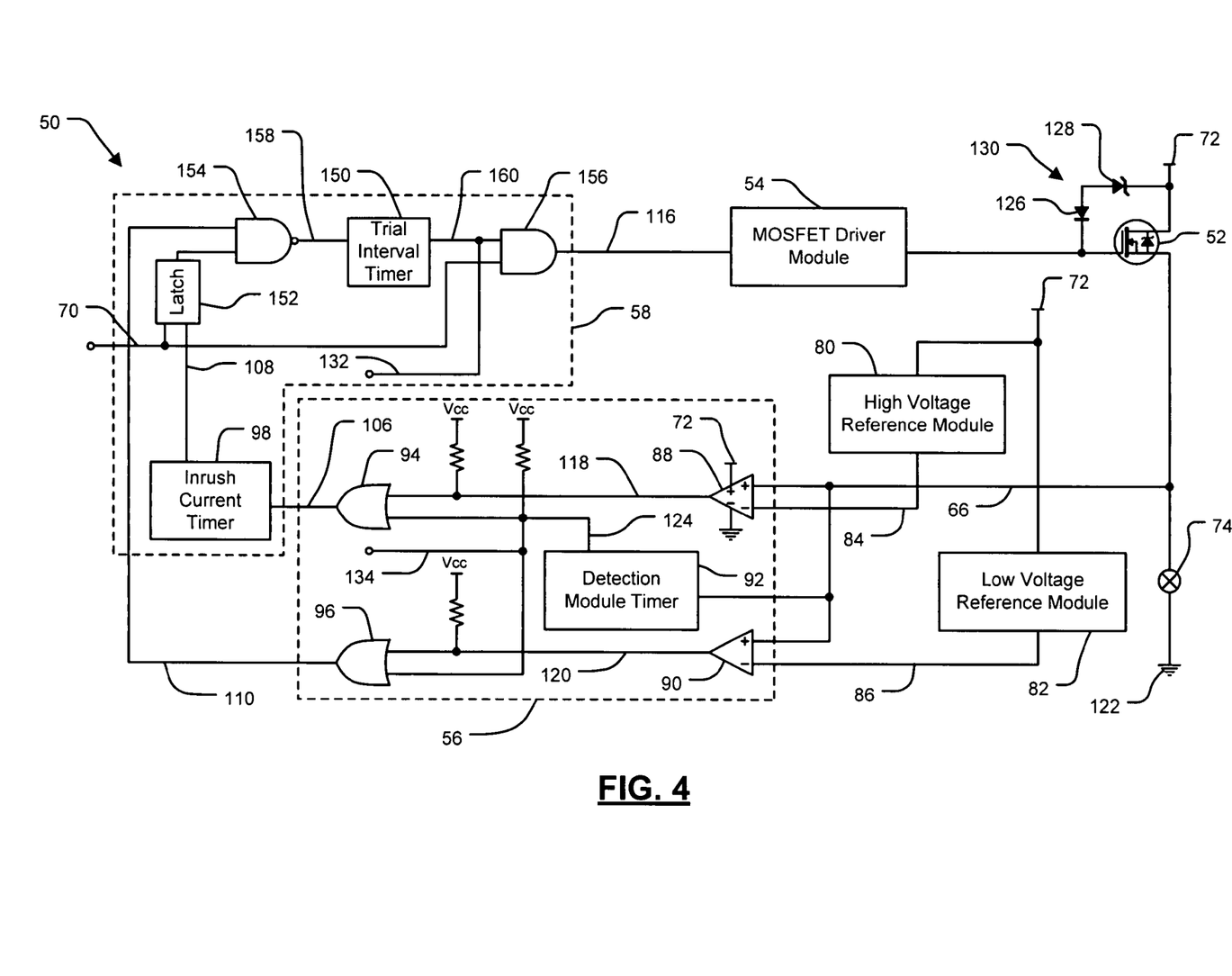
FIG. 4 is a functional block diagram of a sensorless MOSFET protection circuit including a trial interval timer according to the present invention.

Referring now to FIG. 4, a second implementation of the sensorless MOSFET protection circuit 50 includes a trial interval timer 150, a latch 152, logic NAND gate 154, and logic AND gate 156. When a short circuit is detected (i.e. when the detection signal 66 is less than the low voltage reference signal 86), a timer input signal 158 (an output of the first logic AND gate 154) transitions from HIGH to LOW. A timer output signal 160 immediately transitions from HIGH to LOW to turn OFF the MOSFET 52. After a predetermined time, the timer output signal 160 transitions from LOW to HIGH. For example, the timer output signal 160 may transition from LOW to HIGH after 0.5 seconds or 1.0 seconds. In this manner, the trial interval timer 150 prevents the MOSFET 52 from being turned ON immediately after a short circuit condition. The trial interval timer 150 repeats the delayed cycle until after the MOSFET 52 is no longer in the short circuit condition.

Figure 5:
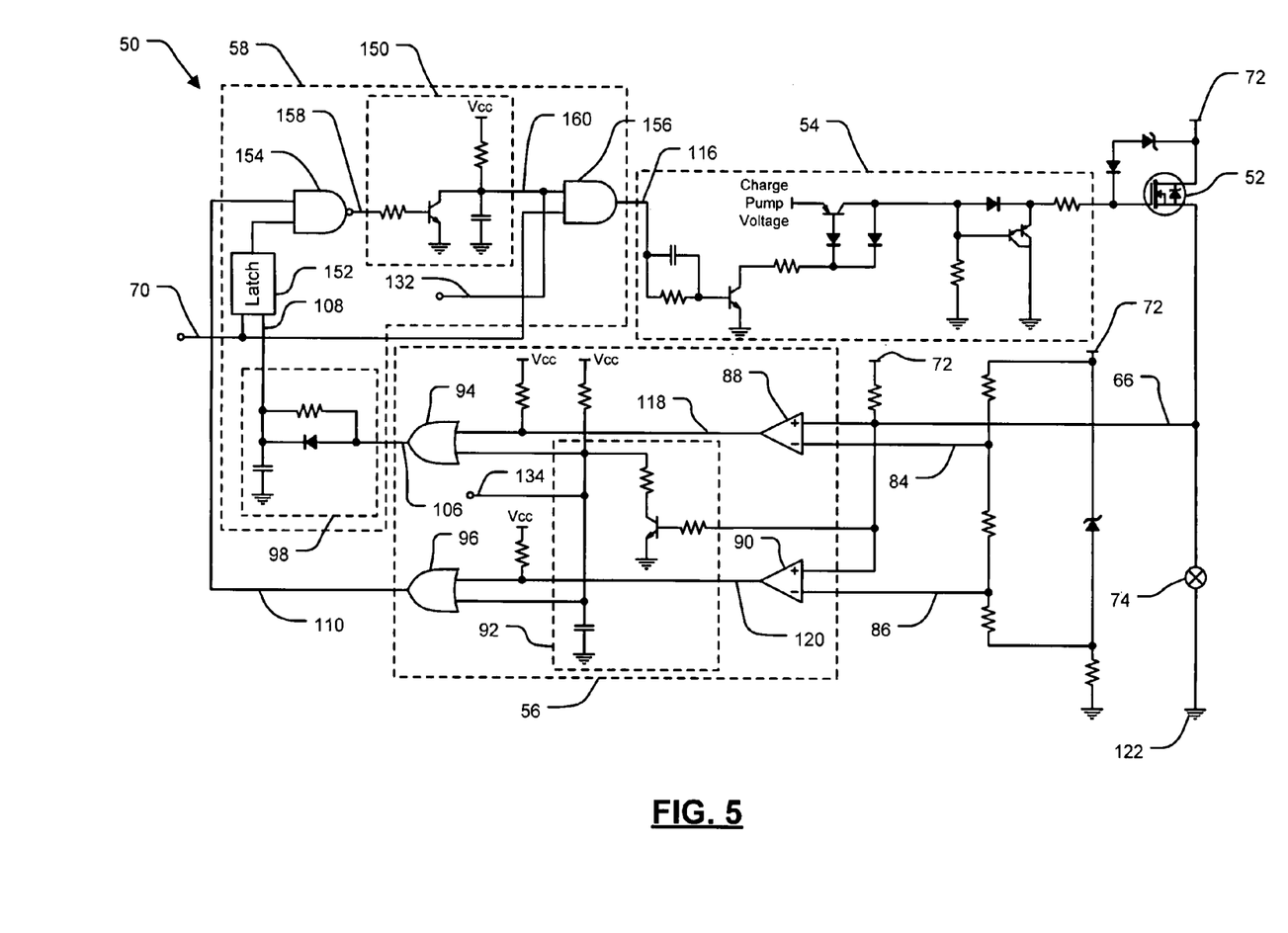
FIG. 5 is a circuit schematic of a sensorless MOSFET protection circuit including a trial interval timer shown in more detail according to the present invention.

Referring now to FIG. 5, the sensorless MOSFET protection circuit 50 as described in FIG. 4 is shown in more detail. In particular, the detection module timer 92, the inrush current timer 98, the trial interval timer 150, and the MOSFET driver module 50 are shown as detailed circuit schematics. Those skilled in the art can appreciate that any number of suitable components can replace those shown in FIG. 5. As such, the components shown in FIG. 5 are merely exemplary and the sensorless MOSFET protection circuit 50 is not to be limited to the presently illustrated embodiment.

Figures 6, 7:
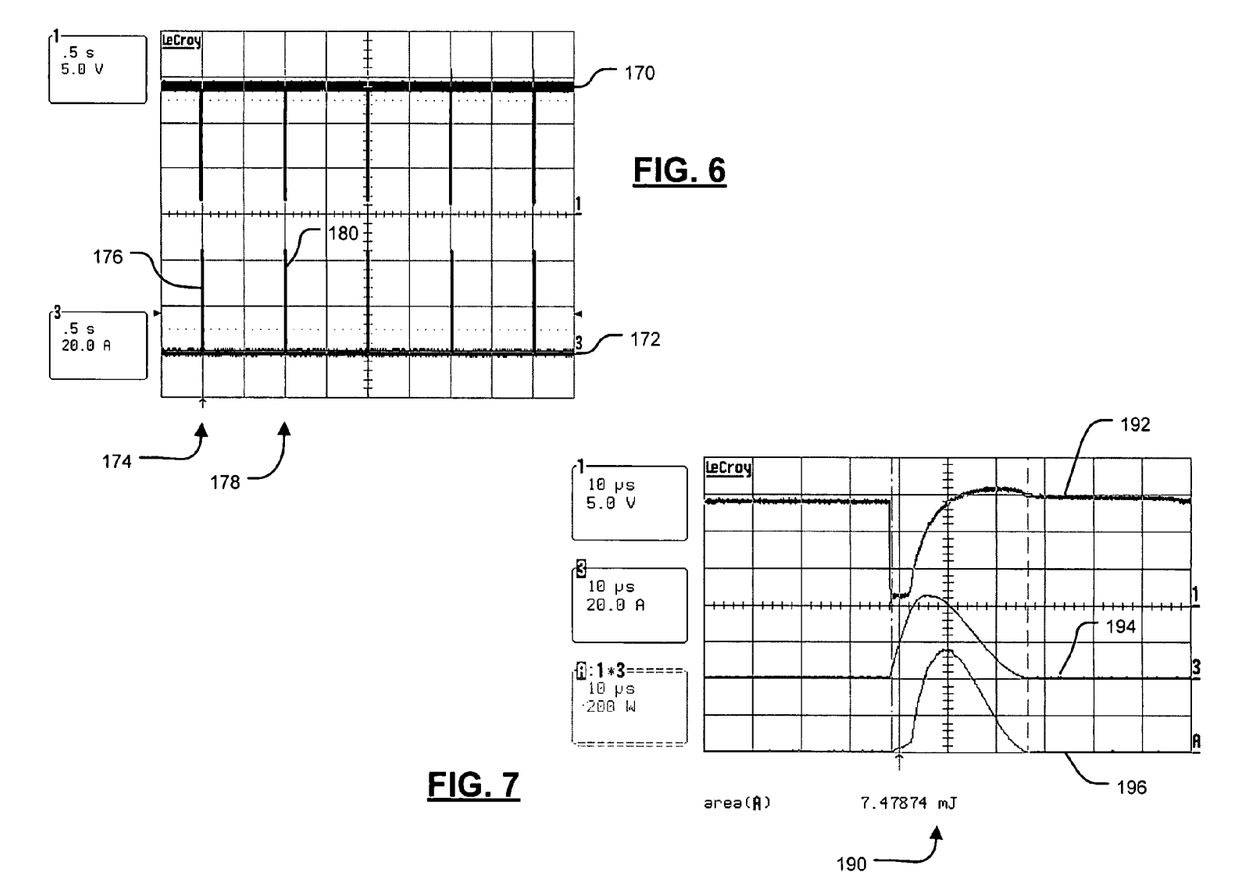
FIG. 6 is a waveform illustration of a retrial interval for a short circuit test according to the present invention.
FIG. 7 is a waveform illustration of MOSFET energy consumption during a short circuit condition according to the present invention.

Referring now to FIG. 6, behavior of the sensorless MOSFET protection circuit during a short circuit condition is illustrated. A first signal 170 illustrates voltage across the drain and source of the MOSFET. A second signal 172 illustrates current through the load. As shown, the trial interval timer outputs a LOW output signal when the first signal 170 indicates a short circuit condition. At a first time indicated at 174, the trial interval timer transitions the output signal from LOW to HIGH to determine whether the short circuit condition is still present, as indicated by a spike 176 in the second signal 172. In other words, the spike 176 indicates a short circuit trial that determines whether the short circuit condition is still present.

Because the first signal 170 continues to indicate a short circuit condition, the trial interval timer immediately transitions the output signal from HIGH to LOW. After a 1.0 second interval, the trial interval timer again transitions the output signal from LOW to HIGH at a second time indicated at 178 and by a spike 180. The trial interval timer again immediately transitions the output signal from HIGH to LOW. In this manner, it can be seen that the protection circuit described in FIGS. 2 through 5 is able to provide MOSFET protection without current and/or temperature sensors.

Referring now to FIG. 7, energy consumption of the MOSFET during a short circuit trial 190 is shown. A first signal 192 indicates a voltage across the drain and source of the MOSFET. A second signal 194 indicates a current through the load. A third signal 196 is a product of the first signal 192 and the second signal 194. In other words, the third signal 196 indicates energy consumption of the MOSFET during the short circuit trial 190. As shown the energy consumption of the MOSFET during the short circuit trial 190 is approximately 7.5 millijoules (mJ).

Figure 8:
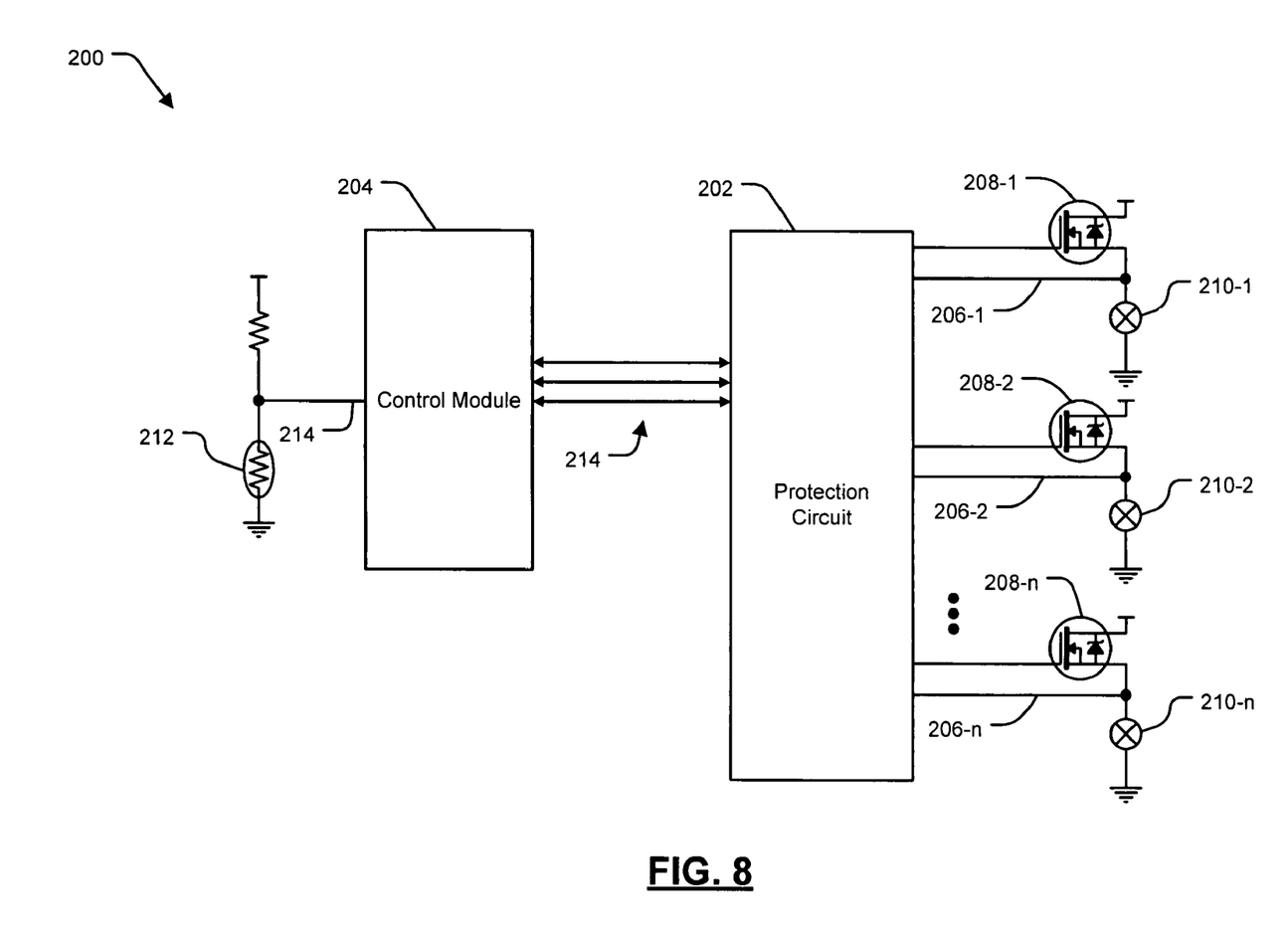
FIG. 8 is a functional block diagram of a sensorless MOSFET protection system according to the present invention.

Referring now to FIG. 8, a sensorless MOSFET protection system 200 includes a multi-channel protection circuit 202 and a control module 204. The protection circuit 202 includes circuitry to implement a sensorless MOSFET protection circuit according to FIGS. 2 through 5. The protection circuit 202 receives detection signals 206-1, 206-2, . . . , and 206-n, referred to collectively as detection signals 206, from MOSFETs 208-1, 208-2, . . . , and 208-n, referred to collectively as MOSFETs 208. The MOSFETs 208 provide current to loads 210-1, 210-2, . . . , and 210-n, referred to collectively as loads 210.

A temperature sensor 212 such as a thermistor monitors ambient temperature. The control module 204 receives an ambient temperature signal 214 and dynamically programs the reference voltages (i.e. the high and low voltage references as described in FIGS. 2 through 5) for each of the MOSFETs 208 according to ambient temperature. For example, at high ambient temperatures, the high voltage reference may be programmed at a first value. At low ambient temperatures, the high voltage reference may be programmed at a second value that is greater than the first value. In this manner, the protection circuit 202 can be dynamically programmed to compensate for ambient temperature changes.

The control module 204 may communicate with the protection circuit 202 and program the voltage references through serial communication lines 216. Further, the control module 204 can send/receive the input control signal and/or receive the status signals through the serial communication lines 216.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A protection circuit comprising:
   a detection module that receives a first reference voltage signal and receives a load voltage signal from a MOSFET, and that generates a detection signal having a first state and a second state according to the first reference voltage signal and the load voltage signal; and a protection module that receives the detection signal and maintains the MOSFET in an ON state when the detection signal is in the first state and transitions the MOSFET from the ON state to an OFF state when the detection signal is in the second state, wherein the MOSFET does not include a current sensor and does not include a temperature sensor, the detection signal is in the second state when the MOSFET is in at least one of a current overload condition and a short circuit condition, and the detection signal is in the second state when the MOSFET is in an over temperature condition.

2. The protection circuit of claim 1 further comprising a first reference voltage module that generates the first reference voltage signal.

3. The protection circuit of claim 2 further comprising a second reference voltage module that generates a second reference voltage signal that is less than the first reference voltage signal.

4. The protection circuit of claim 1 wherein the detection module includes a voltage comparator that receives the load voltage signal and the first reference voltage signal and that generates the detection signal, wherein the detection signal is in the first state when the load voltage signal is greater than the first reference voltage signal and the detection signal is in the second state when the load voltage signal is less than the first reference voltage signal.

5. The protection circuit of claim 1 wherein the detection signal is in the second state when the MOSFET is in at least one of the current overload condition and the short circuit condition, and the load voltage signal is above a threshold, and the detection signal is in the first state when the load voltage signal is below the threshold.

6. A protection circuit comprising:
a first reference voltage module that generates a first reference voltage signal;
a second reference voltage module that generates a second reference voltage signal that is less than the first reference voltage signal;
a detection module that includes a first voltage comparator that receives a load voltage signal from a MOSFET and the first reference voltage signal, a second voltage comparator that receives the load voltage signal and the second reference voltage signal, and that generates first and second detection signals having first and second states according to the first reference voltage signal, the second reference voltage signal, and the load voltage signal; and
a protection module that receives the first and second detection signals and maintains the MOSFET in an ON state when the detection signals are in the first state and transitions the MOSFET from the ON state to an OFF state when at least one of the detection signals is in the second state,
wherein the MOSFET does not include a current sensor and does not include a temperature sensor, and the first detection signal is in the second state when the load voltage signal is less than the first reference voltage signal and the second detection signal is in the second state when the load voltage signal is less than the second reference voltage signal.

7. The protection circuit of claim 6 wherein the load voltage signal is less than the first reference voltage signal when the MOSFET is in at least one of a current overload condition, a startup inrush current condition, and a short circuit condition, and is less than the first reference voltage signal when the MOSFET is in an over temperature condition.

8. The protection circuit of claim 6 wherein the load voltage signal is less than the second reference voltage signal when the MOSFET is in a short circuit condition.

9. The protection circuit of claim 6 wherein the detection module further comprises a detection module timer that receives the load voltage signal and that generates a detection module timer signal having first and second states and the detection module timer signal is in the first state when the load voltage signal is at a ground potential.

10. The protection circuit of claim 6 wherein the protection module includes a inrush current timer that maintains the MOSFET in the ON state when the first detection signal is in the second state for less than a first period and that transitions the MOSFET to the OFF state when the first detection signal is in the second state for greater than the first period.

11. The protection circuit of claim 6 wherein the protection module further comprises a trial interval timer that maintains the MOSFET in the OFF state for a first period when the second detection signal transitions from the first state to the second state.

12. The protection circuit of claim 11 wherein the trial interval timer transitions the MOSFET from the OFF state to the ON state after the first period.

13. The protection circuit of claim 9 wherein the load voltage signal is at the ground potential when a load connected to the protection circuit is OFF.

14. A protection system for a MOSFET, comprising:
at least one reference voltage module that generates at least one reference voltage signal;
a detection module that receives the reference voltage signal and receives a load voltage signal from a MOSFET, and that generates a detection signal having a first state and a second state according to the reference voltage signal and the load voltage signal;
a protection module that receives the detection signal and maintains the MOSFET in an ON state when the detection signal is in the first state and transitions the MOSFET from the ON state to an OFF state when the detection signal is in the second state; and
a control module that communicates with the reference voltage module and a temperature sensor, that receives a temperature signal from the temperature sensor, that determines a value of the reference voltage signal according to the temperature signal, and that programs the reference voltage module according to the value,
wherein the MOSFET does not include a current sensor and does not include a temperature sensor, the detection signal is in the second state when the MOSFET is in at least one of a current overload condition, a startup inrush current condition, and a short circuit condition, and the detection signal is in the second state when the MOSFET is in an over temperature condition.

* * * * *